United States Patent [19]

Eltoukhy et al.

[11] Patent Number: 5,008,855
[45] Date of Patent: Apr. 16, 1991

[54] METHOD OF PROGRAMMING ANTI-FUSE ELEMENT

[75] Inventors: Abelshafy A. Eltoukhy, San Jose; David H. Gluss, Woodside, both of Calif.

[73] Assignee: Actel Corporation, Sunnyvale, Calif.

[21] Appl. No.: 381,630

[22] Filed: Jul. 18, 1989

[51] Int. Cl.$^5$ .................. G11C 7/00; G11C 11/21
[52] U.S. Cl. .................. 365/96; 365/225.7
[58] Field of Search .................. 365/96, 225.7

[56] References Cited

U.S. PATENT DOCUMENTS 4,734,886  3/1988  Blankenship et al. .......... 365/96
4,855,613  8/1989  Yamada et al. .......... 365/96

Primary Examiner—James W. Moffitt
Attorney, Agent, or Firm—Kenneth D'Alessandro

[57] ABSTRACT

In a method for programming an antifuse element which includes a pair of conductive electrodes separated by an insulating layer a predetermined number of voltage pulses are first applied across the electrodes of the antifuse and the current drawn by the antifuse is simultaneously measured. When the measured current indicates that the antifuse dielectric has ruptured, a second step includes continuing to apply pulses and calculating the difference in current sensed between successive measurements. In a third step, a predetermined number of additional pulses are applied after the difference in current between successive pulses falls below a predetermined threshold. In a fourth step, an additional predetermined number of pulses are applied and the current drawn at the end of the sequence is measured. If it is greater than the current drawn at the beginning of the sequence by a predetermined threshold, the third step is repeated. If not, the programming process ends.

1 Claim, 2 Drawing Sheets

METHOD OF PROGRAMMING ANTI-FUSE ELEMENT

BACKGROUND OF THE INVENTION

1. Field Of The Invention

The present invention relates to the field of userprogrammable anti-fuse elements. More particularly, the present invention relates to methods for programming anti-fuse elements.

2. The Prior Art

Fusible links and other memory type elements used in present semiconductor technology either require little current (as in electrically erasable programmable read only memories known as EEPROMS) or have a clearly-defined final condition (e.g., a normal fuse, which is simply an open circuit once blown). In the case of the EEPROM, the method used is to double or multiply by some other factor the time at which the element first appears to have been programmed. This technique is much more sensitive, and improves the uniformity of the programmed device. This technique, however, results in programming times which are significantly increased, and, if applied to anti-fuse elements, which exhibit programming times on the order of several milliseconds, would result in prohibitively long programming times. There is thus a need in the art for a method of programming anti-fuse elements which results in reliably programmed devices, but which does not consume an inordinate amount of time.

BRIEF DESCRIPTION OF THE INVENTION

The method of the present invention involves in a first step presenting a series of programming pulses using a programming voltage $V_{pp}$ to the anti-fuse element to be programmed. The current drawn by the anti-fuse element during each pulse the element receives is measured. The current is measured during each pulse until a predetermined threshold current has been exceeded. The sensing of the predetermined threshold current is an indication that a conductor has been established through the dielectric layer of the anti-fuse. If the predetermined threshold current has not been sensed after a predetermined maximum number of pulses are applied, the programming sequence is discontinued and the anti-fuse is noted as a problem fuse.

In a second step, the pulsing is continued and the difference in current between successive measurements, as opposed to the current itself, is measured. When the difference between successive measurements drops below a predetermined threshold, a predetermined number of additional pulses are applied and the current drawn is measured.

In a third step, a predetermined number of additional pulses are then applied. If the current drawn at the end of this sequence is greater than the current measured at the beginning of the third step by a predetermined threshold, the third step is repeated, and if it is not greater than the current measured at the beginning of the sequence by the predetermined threshold, the programming sequence is complete.

DETAILED DESCRIPTION OF A PREFERRED EMBODIMENT

The present invention is useful for programming anti-fuses of the type disclosed and claimed in U.S. Pat. No. 4,823,181, issued on Apr. 18, 1989 to the same assignee as the present invention, although it is believed that the present invention is useful for programming other types of anti-fuses.

Because the individual final resistance characteristics of different anti-fuse elements will vary from element to element, and because, in an actual array of anti-fuses, the individual programming circuit paths involve varying numbers of circuit elements in the programming circuit path, the actual value of the measured current will not indicate whether an individual anti-fuse has reached its lowest possible resistance, the difference in current between successive measurements, as opposed to the current itself, is used to indicate when the programming of an individual anti-fuse has been completed. This procedure assures that the lowest possible resistance of each individual anti-fuse has been achieved.

Figure 1:
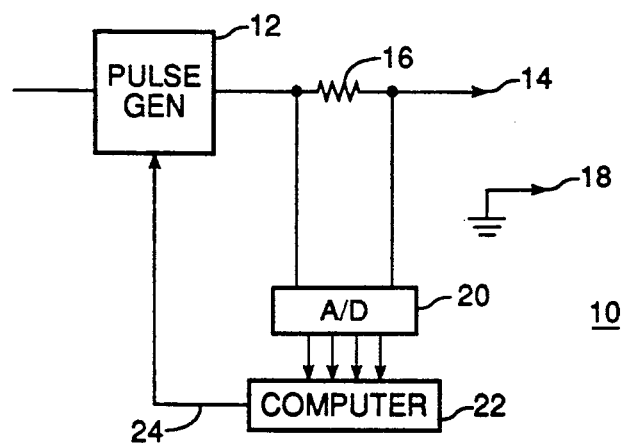
FIG. 1 is a block diagram of apparatus for performing the method of the present invention according to a presently-preferred embodiment of their invention.

Referring first to FIG. 1, a presently preferred embodiment of apparatus for performing the method of the present invention is disclosed. The apparatus 10 includes a pulse generator 12 having its output connected to a terminal 14 through a series resistance 16. Another terminal 18 is connected to a source of fixed potential, shown in FIG. 10 as ground.

The voltage of cross-resistor 16 is applied to the analog input of analog/digital (A/D) converter 20. The output of A/D converter 20 is supplied as an input to computer 22. An output 24 from computer 22 is used to control the pulses from pulse generator 12. Pulse generator 12 should be capable of supplying voltage pulses having a positive D/C magnitude equal to $V_{pp}$, the programming voltage to be applied to the anti-fuses. In a presently-preferred embodiment the pulse width of the pulses from pulse-generator 12 should be approximately 150 microseconds, although pulses anywhere from approximately 100 microseconds to several milliseconds may be used.

In a presently-preferred embodiment the pulses from pulse generator 12 include a first portion having a voltage magnitude of $V_{pp}$ of half $V_{pp}$ for a duration of approximately 20 microseconds. In addition, the maximum rise and fall times of pulses from pulse generator 12 should be about 2 volts per microsecond. No particular form of pulse generator 12 is preferred, and any circuit, easily configured by those of ordinary skill in the art, may be used for this purpose.

As presently preferred, A/D converter 20 may have an eight-bit digital output, and resistor 16 should be selected such that the range of currents expected from fully blown anti-fuses flowing through resistor 16 causes a voltage approximately equal to the input range of A/D converter 20.

Computer 22 may be any small general purpose computer, such as a personal computer.

Figure 2:
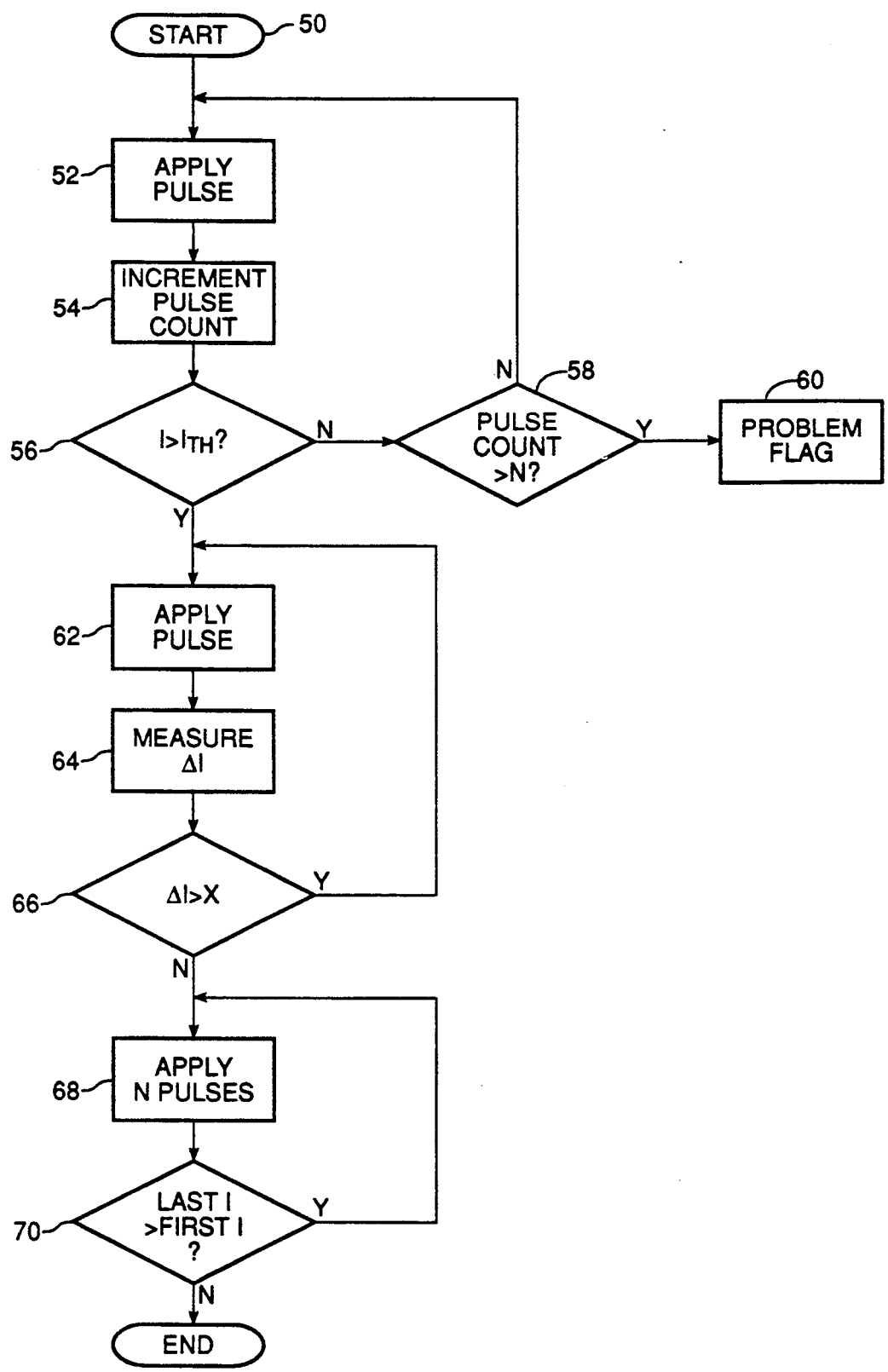
FIG. 2 is a flow diagram of a presently preferred embodiment of the method of the invention.

Referring now to FIG. 2, a flow diagram of the presently-preferred method of the present invention is depicted. First, at start 50, all registers and counters are initialized as is readily and easily understood by those of ordinary skill in the art. Next, at step 52, a pulse is applied to the antifuse to be programmed via pulse generator 12 and resistor 16 and terminals 14 and 18 (FIG. 1) and at step 54 the pulse count is incremented. Next, at step 56 it is determined whether the current measured as a result of the pulse is greater than a threshold current. If not, at step 58 the decision is made whether the pulse count has exceeded a predetermined threshold. If the predetermined threshold has not been exceeded, the program returns to step 52. If, however, the threshold has been exceeded, at step 60 a routine is initiated to indicate that the anti-fuse to be programmed is not being programmed correctly.

If, at step 56, the currently threshold has been exceeded at step 62 a pulse is applied to the anti-fuse. At step 64, the difference in current between that pulse and the immediately preceding pulse is measured. Next, at step 66 the difference in current is compared with a pre-set threshold. If the threshold is exceeded, the program returns to step 62. If, however, the threshold has not been exceeded at step 68 a fixed number of N pulses is applied. Next, at step 70, a decision is made whether the current measured during the occurrence of the last pulse is greater than the current measured at the first of the pulses. If so, the program returns to step 68. If not, the anti-fuse programming is completed and the program terminates for that anti-fuse.

In an alternate embodiment of the present invention, computer 22 may be used to keep track of the total number of pulses taken to program each anti-fuse within a single chip or die. After a statistically significant number of anti-fuses have been programmed, computer 22 may control pulse generator 12 to put out a single pulse having half $V_{pp}$ level as previously described, followed by a $V_{pp}$ level for a duration equal to the duration of combined $V_{pp}$ levels of the number of pulses required to program each anti-fuse. In this manner, programming time may be further reduced by eliminating the 20 microsecond half of $V_{pp}$ pulses as well as the measuring and computation times involve for each individual pulse. Creating software to perform this task is a trivial exercise to one of ordinary skill in the art.

Figure 3:
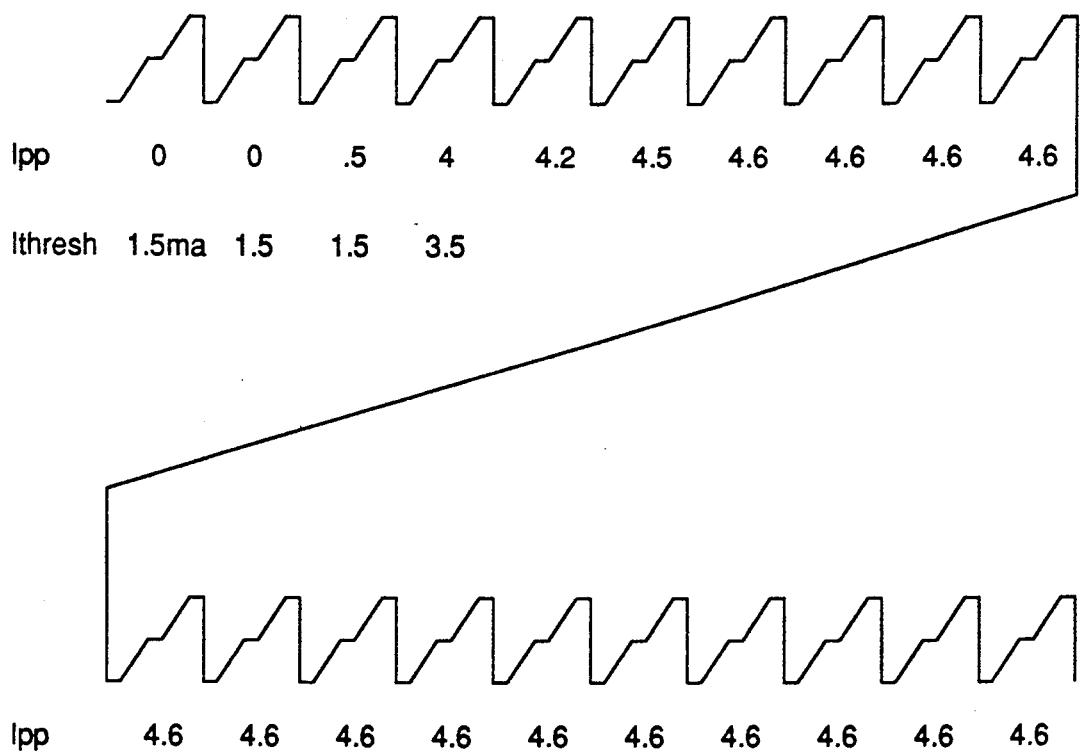
FIG. 3 is an illustrative chain of programming pulses according to a presently preferred embodiment of the present invention.

Referring now to FIG. 3, a typical train of pulses for programming an anti-fuse is shown. Those of ordinary skill in the art will note from FIG. 3 that, as of the fifth pulse, the current threshold has been exceeded. As of the eighth pulse the difference in current is 0. The eighth pulse is then followed by a fixed number of 12 pulses.

While a presently-preferred embodiment of the invention has been disclosed, those of ordinary skill in the art will, from an examination of the within disclosure and drawings be able to configure other embodiments of the invention. These other embodiments are intended to fall within the scope of the present invention which is to be limited only by the scope of the appended claims.

What is claimed is:

1. A method of programming an anti-fuse including the steps of:
    (1) Applying voltage pulses to said anti-fuse, said voltage pulses including a first portion having a first amplitude less than the voltage necessary to program said anti-fuse, and having a second portion having a second amplitude equal to the voltage necessary to program said anti-fuse,
    (2) Measuring the current drawn by said anti-fuse from said second portion of said voltage pulse,
    (3) Determining whether said current drawn by said anti-fuse exceeds a predetermined threshold,
    (4) Repeating steps 1 through 3 if said current does exceed predetermined threshold,
    (5) Applying a series of pulses to said anti-fuse if said current does exceed said predetermined threshold,
    (6) Measuring the difference in current drawn by said anti-fuse between successive ones of the voltage pulses applied in step 5,
    (7) Repeating step 5 if said difference in current exceeds a predetermined threshold,
    (8) Applying a fixed number of pulses if said difference does not exceed said predetermined threshold,
    (9) Measuring the current drawn by said anti-fuse at the first and last ones of said fixed number of pulses,
    (10) Repeating step 9 if the difference between the current drawn during said first and last ones of said fixed number of rules exceeds a predetermined threshold.

* * * * *